(12) United States Patent
Schöniger et al.

(10) Patent No.: US 6,401,224 B1
(45) Date of Patent: Jun. 4, 2002

(54) INTEGRATED CIRCUIT AND METHOD FOR TESTING IT

(75) Inventors: Sabine Schöniger; Peter Schrögmeier; Thomas Hein, all of München; Stefan Dietrich, Türkenfeld, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/261,100

(22) Filed: Mar. 2, 1999

(30) Foreign Application Priority Data

Mar. 2, 1998 (DE) .......................................... 198 08 664

(51) Int. Cl.[7] .................... G01R 31/28; G01R 31/02; G11C 29/00
(52) U.S. Cl. .................... 714/718; 714/727; 324/754; 324/763
(58) Field of Search ................ 714/718, 719, 714/727, 733; 324/754, 763, 765

(56) References Cited

U.S. PATENT DOCUMENTS

| | | | | |
|---|---|---|---|---|
| 4,520,314 A | * | 5/1985 | Asch et al. .................. 324/762 |
| 5,012,187 A | * | 4/1991 | Littlebury .................... 324/754 |
| 5,371,390 A | | 12/1994 | Mohsen | |
| 5,471,480 A | * | 11/1995 | You ............................ 714/719 |
| 5,491,427 A | * | 2/1996 | Ueno et al. .................. 324/754 |
| 5,506,499 A | * | 4/1996 | Puar .......................... 324/158.1 |
| 5,594,273 A | * | 1/1997 | Dasse et al. ................ 257/620 |
| 5,594,694 A | * | 1/1997 | Roohparvar et al. ........ 365/201 |
| 5,608,335 A | * | 3/1997 | Tailliet ........................ 324/763 |
| 5,627,842 A | * | 5/1997 | Brown et al. ................ 714/727 |
| 5,794,175 A | * | 8/1998 | Conner ........................ 702/119 |
| 5,841,784 A | * | 11/1998 | Chan et al. .................. 714/718 |
| 5,889,713 A | * | 3/1999 | Chan et al. .................. 365/201 |
| 6,145,104 A | * | 11/2000 | Feddeler et al. ............. 714/724 |

FOREIGN PATENT DOCUMENTS

| | | |
|---|---|---|
| DE | 27 30 917 B2 | 12/1979 |
| DE | 38 30 573 A1 | 4/1989 |

* cited by examiner

*Primary Examiner*—Albert Decady
*Assistant Examiner*—Joseph D. Torres
(74) *Attorney, Agent, or Firm*—Herbert L. Lerner; Laurence A. Greenberg; Werner H. Stemer

(57) ABSTRACT

A test method suitable for testing at least one integrated circuit which, on a main area, has contact areas that serve to transfer signals during a first operating mode of the circuit. Only some of the contact areas are contact-connected to test contacts of a test apparatus and the circuit is put into a second operating mode in which the signals which are transferred via at least one of the non-contact-connected contact areas in the first operating mode are transferred via at least one of the contact-connected contact areas.

10 Claims, 3 Drawing Sheets

INTEGRATED CIRCUIT AND METHOD FOR TESTING IT

BACKGROUND OF THE INVENTION

Field of the Invention

The invention relates to an integrated circuit and to a method for testing the integrated circuit via contact areas disposed on a main area of the circuit.

Integrated circuits are fabricated on wafers composed of semiconductor material. Each wafer has a number, the number being very large under certain circumstances, of mutually adjacent integrated circuits which are disposed in such a way that the area of the wafer is utilized to the best possible effect. The main areas of the integrated circuits are usually rectangular. Contact areas are situated on the surface of each integrated circuit, via which contact area signals can be transferred from and to the integrated circuit. The contact areas are also referred to as pads.

In order to test the integrated circuits situated on the wafer, the contact areas are usually contact-connected to test probes (that is to say test contacts in the form of needles) of a test apparatus. The signals are then transferred from the test apparatus to the integrated circuit, and vice versa, via the test probes and the contact areas which are contact-connected thereto.

Many integrated circuits have contact areas only along two opposite sides of the main area. If two of the integrated circuits are disposed next to one another on a wafer, all of their contact areas can be contact-connected simultaneously to test probes without difficulty. However, there are also integrated circuits that have contact areas on more than two sides of their main area. In order to be able to test such a circuit, it is necessary for test probes to be contact-connected to the corresponding contact areas from all four sides. If two circuits of this type are adjacent to one another on the wafer, the contact areas cannot readily be contact-connected simultaneously to test probes since it is then possible for the test probes to experience a crossover, above all at the mutually adjacent sides of the two circuits. Therefore, adjacent circuits with contact areas on four sides are, as a rule, contact-connected and tested one after the other. This prolongs the time required for testing a plurality of adjacent circuits in comparison with the case of simultaneously testing the circuits.

SUMMARY OF THE INVENTION

It is accordingly an object of the invention to provide an integrated circuit and method for testing it that overcome the above-mentioned disadvantages of the prior art devices and methods of this general type, in which testing via its contact areas using test contacts is facilitated.

With the foregoing and other objects in view there is provided, in accordance with the invention, an integrated circuit, including: a first sub-circuit; a first contact area transferring data to and from the first sub-circuit during a first operating mode; and a second sub-circuit; a second contact area transferring data to and from the second sub-circuit in the first operating mode, in a second operating mode the second contact area transferring data to and from the first sub-circuit.

The integrated circuit according to the invention has at least one first and one second contact area for data transfer from and/or to a first and/or a second sub-circuit in a first operating mode of the circuit. It being the case that in a second operating mode of the circuit, the second contact area serves for data transfer from and/or to the first sub-circuit.

In the second operating mode, then, the second contact areas serve to transfer signals that are to be transferred via the corresponding first contact areas in the first operating mode. Therefore, the function performed by the first contact area in the first operating mode is taken over by the second contact area in the second operating mode. The corresponding signals are therefore fed into and/or removed from the circuit in the second operating mode at a different location (namely that of the second contact area) from that in the first operating mode. As a result, these signals can be transferred without any problems in the second operating mode if the first contact area can be contact-connected only with difficulty to test contacts of a test apparatus and the second contact area, on the other hand, can readily be contact-connected.

The circuit according to the invention is suitable for a procedure in which only the second contact areas, but not the first contact areas, are contact-connected to test probes in the second operating mode, with the result that the functions performed by the first contact areas in the first operating mode can then be tested via the second contact areas. This facilitates, in particular, the simultaneous testing of circuits which are adjacent on a wafer and in which the first contact areas are disposed on mutually facing sides of the circuits, where they can be contact-connected simultaneously to test contacts only with difficulty.

In the second operating mode, the second contact area may serve, on the one hand, exclusively to transfer signals that are transferred via the first contact areas in the first operating mode. The signals that are to be transferred via the second contact area in the first operating mode are not transferred via the second contact area in that case. This is possible, for example, if the second operating mode is a test operating mode of the circuit in which a smaller number of contact areas are required than in the first operating mode, because only specific functions of the circuit are tested.

In the second operating mode, the second contact area may also serve, in addition to transferring the signals which are to be transmitted via the first contact area in the first operating mode, furthermore to transfer the signals which it also transfers in the first operating mode. This can be realized for example by the second contact area serving to transfer the various types of signals using time division multiplexing in the second operating mode.

According to a development of the invention, the first and the corresponding second contact areas are disposed in respectively different rows of contact areas, the rows being respectively disposed parallel on different sides of a main area of the circuit.

In this case, in the second operating mode, bottlenecks in the event of contact-connecting the circuit to test probes at the side with the first contact areas are circumvented by displacing their function to the second contact areas. If there are two directly adjacent circuits on a wafer, e.g. the mutually facing sides constitute bottlenecks of this type, since it is there that, without the invention, test probes must be contact-connected on both circuits in direct proximity to one another, with the result that the risk of the test contacts experiencing a crossover is particularly high in this region. The invention makes it possible to gain space at the most critical location for attaching the test contacts (the location being the one at which the two circuits face one another) by the use of fewer test contacts than there are contact areas, it being possible for contact to be made with the remaining contact areas more easily as a result.

If the first contact areas are disposed on at least one of two opposite sides of the main area and the second contact areas are disposed on at least one of two other, likewise opposite sides, contact-connection bottlenecks at the first-mentioned two sides are circumvented in the second operating mode. Therefore, the simultaneous contact-connection and testing of at least three adjacent circuits is advantageously facilitated, which circuits are disposed in such a way that the first contact areas are in each case disposed on the side facing the adjacent circuit. At these sides, fewer contact areas than are present have to be contact-connected in the second operating mode. On the other hand, those sides on which the second contact areas are situated can be contact-connected without difficulty and without the test probes experiencing a crossover, since no adjacent circuits which are to be contact-connected simultaneously are disposed on these sides. Of course, it is also possible for more than three of the circuits according to the invention to be adjacent to one another with regard to their sides having the first contact areas and to be tested simultaneously.

According to a development, the integrated circuit is an integrated memory circuit in which at least one of the first contact areas is an address contact area which serves, in the first operating mode, to transfer an address signal for addressing the memory circuit, and in which the corresponding second contact area serves, in the second operating mode, to transfer the address signal. The address signal serves for addressing memory cells of the memory circuit.

Especially for dynamic memories (DRAMs), there is a JEDEC standard which provides for the initiation of test operating modes (Test Mode Entry) using all the address terminals. If it is desired that the functions provided there will be fulfilled both in the first and in the second operating mode, the function of all the address contact areas must therefore also be available in the second operating mode. This can be achieved by the invention by the function of the first contact area being displaced to the second contact area in the second operating mode in the manner described. In the case of this memory circuit, therefore, a JEDEC Test Mode Entry and complete addressability of its memory cells are also ensured in the second operating mode, if the second contact areas are contact-connected instead of the first contact areas.

It is expedient when the second contact area is a data contact area that serves, in the first operating mode, to transfer data which are stored and/or are to be stored in the circuit. This development is suitable e.g. for a memory circuit whose second operating mode is a test operating mode requiring all the external address signals which are required in the first operating mode as well, but not all the data contact areas which are used in the first operating mode.

The function of the second contact area as a data contact area is dispensable in the second operating mode for example when the transfer of the corresponding data is obviated by a self-test carried out (under certain circumstances only partly) on the circuit. In one kind of self-test, e.g. required test data are generated on the memory circuit, written to the memory cells, read back from the cells and compared with the written-in desired values within the memory circuit. In the extreme case, just a single result signal is communicated to a point outside the circuit via one of the contact areas after the conclusion of the self-test, which result signal indicates whether or not the test has been passed (pass/fail signal). If one data contact area is used for this purpose, all the further data contact areas that are consequently not required are available in the test operating mode as potential second contact areas in the sense of the invention. These contact areas may be provided for the replacement of corresponding first contact areas.

The test data can, for example, also be read from and/or written to the memory circuit in another compressed form in the second operating mode, the memory cell contents read out are partly evaluated on the memory circuit and only the result of the evaluation are communicated externally via the contact areas. This, too, can be realized using a relatively small number of data terminals, with the result that, in the second operating mode, not all of the data contact areas are required and, therefore, they can likewise be provided as second contact areas.

According to a development, the integrated circuit has a third contact area for the application of a control signal, the circuit being transferred from the first operating mode to the second operating mode as a function of the control signal. The control signal enables the function of the first contact areas to be displaced to the second contact areas. The displacement being controlled externally via the third contact area, with the result that the operation in the second operating mode can subsequently be begun without the first contact areas being contact-connected.

Since the second operating mode serves to facilitate the contact-connection of the circuit to test contacts of a test apparatus, the second operating mode is no longer necessary once the integrated circuit is removed from the congested wafer. In particular, it may be provided that in the case of a housed IC, the third contact area is not connected to a housing terminal (Pin) present exclusively for this. The area is then used merely as a test contact area during the test phase of the unhoused IC, the test phase following the fabrication of the circuit, and an additional housing terminal is not necessary. Conventional housings can be used instead.

The test method according to the invention can be applied, in particular, to the integrated circuit according to the invention. It provides the following steps in the second operating mode:

a) the second contact areas are contact-connected to test contacts of a test apparatus, and b) signals which are transferred via the corresponding first contact areas in the first operating mode of the circuit are transferred via the second contact areas.

In the second operating mode, it is advantageous that the first contact areas do not have to be contact-connected to test contacts, since their function is taken over by the second contact areas. The position of the second contact area can then be chosen such that contact can be made with it more simply than with the first contact area. This is particularly advantageous when testing adjacent integrated circuits on a wafer, the first contact areas of which circuits are disposed in such a way that their simultaneous contact-connection to test contacts is possible only with a great deal of difficulty. The test method according to the invention facilitates the simultaneous testing of adjacent circuits of this type. As a result, adjacent circuits do not have to be tested one after the other, the time required for testing all the circuits thereby being reduced.

Other features which are considered as characteristic for the invention are set forth in the appended claims.

Although the invention is illustrated and described herein as embodied in an integrated circuit and method for testing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
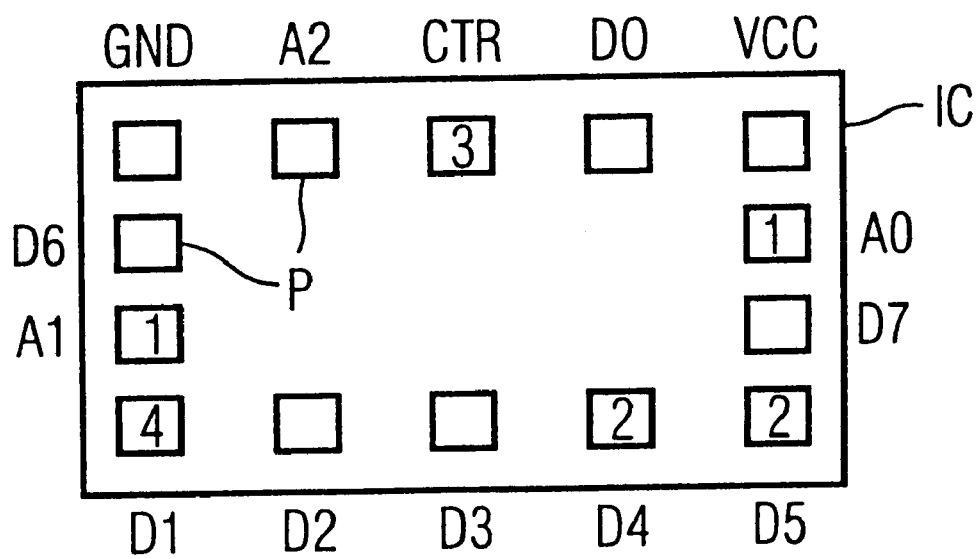
FIG. 1 is a diagrammatic plan view of an integrated circuit with a signal allocation of its contact areas in a normal operating mode according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated memory circuit IC in a plan view of one of its main areas MA, with contact areas P disposed along four sides of the main area MA. The memory circuit IC is a DRAM, but the invention can also be applied to other circuits, in particular other memory circuits. The contact areas P serve to transfer signals, which are portrayed in FIG. 1, in a normal or first operating mode. By way of example, two supply potentials VCC, GND, three address signals or address bits A0 . . . A2 and eight data signals or data bits D0 . . . D7 are depicted. Only a few contact areas, essential for understanding the invention, are illustrated together with their signal allocation. Memory cells contained in the memory circuit are addressed by the address signals A0 . . . A2 and the related data bits D0 . . . D7 can subsequently be read into the memory cells or be read from the memory cells.

In the normal operating mode, two of the address signals A0, A1 are assigned to first contact areas 1 on the right-hand and left-hand side, respectively, of the main area MA, while two of the data bits D4, D5 are assigned to second contact areas 2 on the lower side of the main area MA. In addition, a third contact area 3 is disposed in the center of an upper side of the main area MA. The third contact area serves for the application of a control signal CTR, which will be discussed in more detail further below with reference to FIG. 3 and as a function of which the integrated memory circuit IC changes over from the normal operating mode to a test operating mode.

Figure 2:
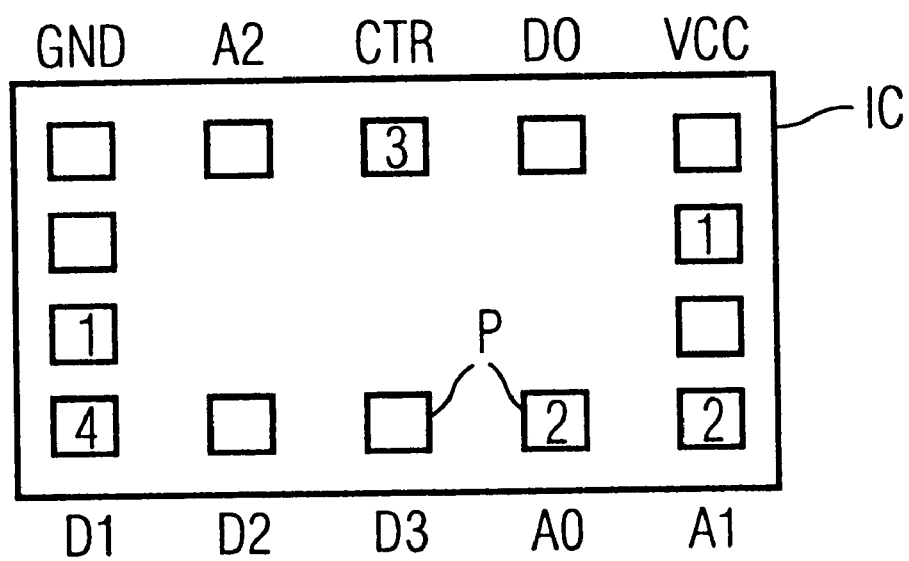
FIG. 2 is a plan view of the integrated circuit with the signal allocation of its contact areas in a test operating mode.
Figure 4:
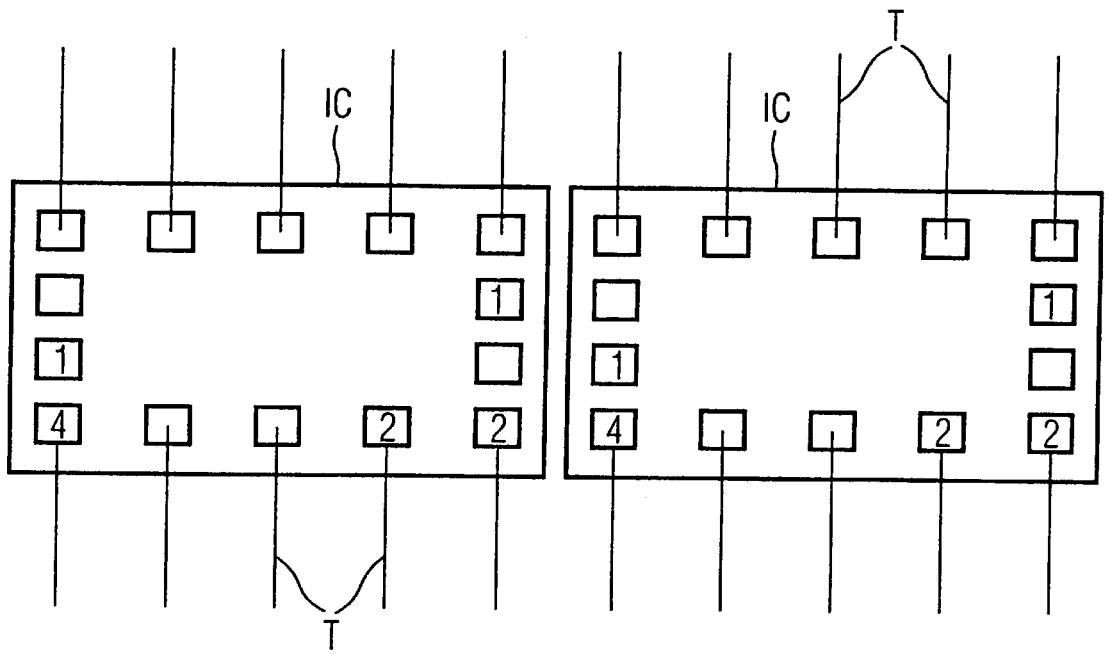
FIG. 4 is a plan view of an exemplary embodiment of the test method using two integrated circuits according to FIG. 1 which are adjacent on a wafer.

FIG. 2 shows the signal allocation of the contact areas of the integrated circuit IC from FIG. 1 during the test or second operating mode. The address signals A0, A1 transferred via the first contact areas 1 in the normal operating mode are now transferred via the second contact areas 2, which serve to transfer the data bits D4, D5 in the normal operating mode. Consequently, contact areas are available for all three address signals A0 to A2 both in the normal operating mode and in the test operating mode. By contrast, only four contact areas are available for transferring data bits D0 . . . D3 in the test operating mode. This is because the two contact areas for the data bits D6, D7 on the left-hand and right-hand side, respectively, of the integrated memory circuit IC are not available in the test operating mode. In the test operating mode, namely, the intention is to test the integrated memory circuit IC solely by contact-connecting the contact areas on their upper and lower sides, as is illustrated in FIG. 4, which will be discussed further below. Therefore, the number of contact areas available for data transfer varies in the two operating modes, while the number of address contact areas remains constant.

Since the number of address contact areas in the test operating mode corresponds to that in the normal operating mode, unrestricted addressing of the memory cells of the integrated memory circuit IC is possible in both operating modes. In order to be able to carry out a memory test despite the halving of the number of data contact areas in the test operating mode in comparison with the normal operating mode, the data to be transferred from and to the integrated memory circuit IC are compressed in the test operating mode. This is explained below with reference to FIG. 3 in connection with the changeover between the two operating modes.

Figure 3:
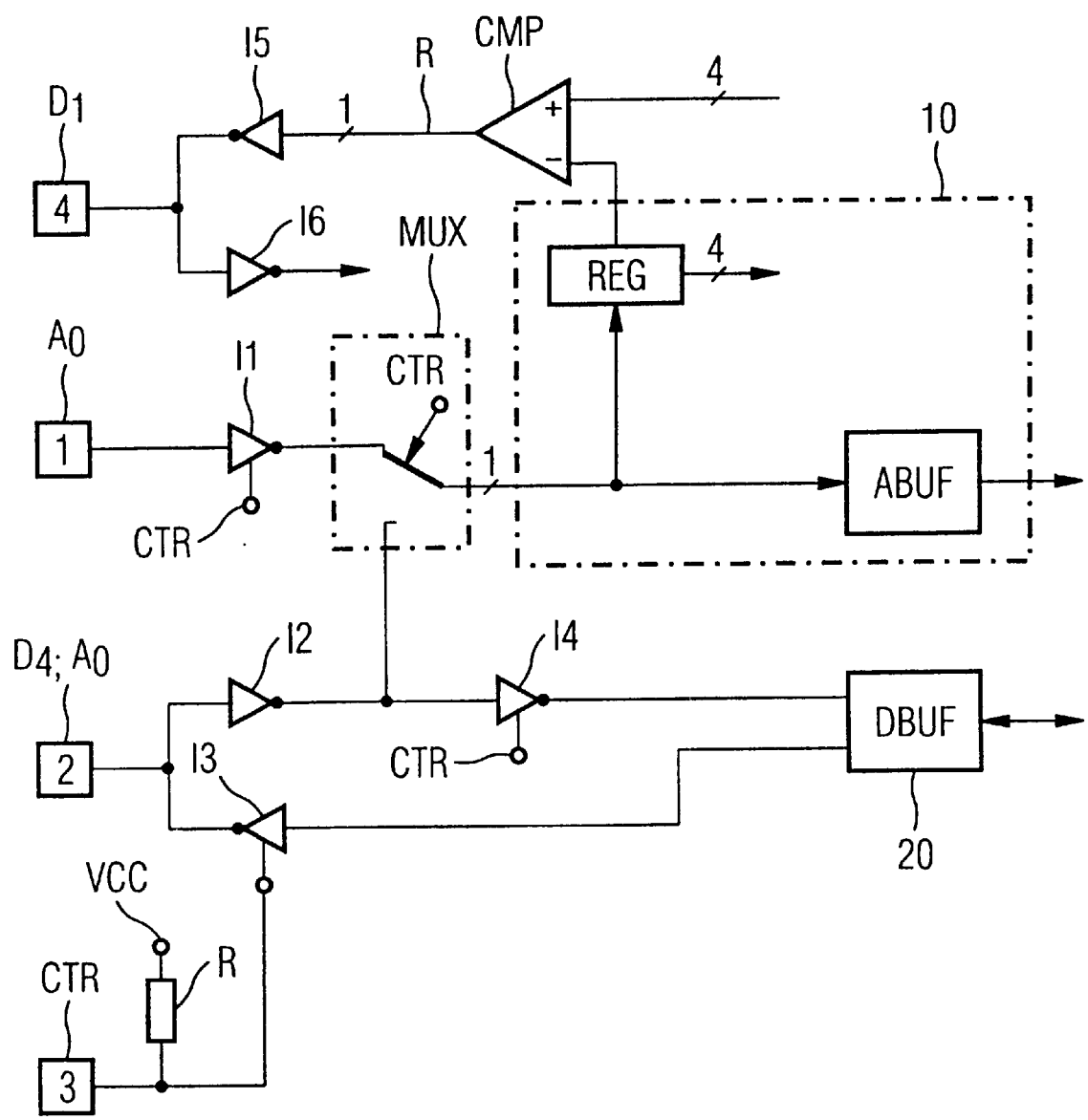
FIG. 3 is a circuit diagram of a detail of the integrated circuit.

FIG. 3 shows a detail of the integrated memory circuit IC from FIG. 1. The illustration depicting one of the first contact areas 1, which serves for the application of the address signal or address bit A0 in the normal operating mode, and the second contact area 2 which is assigned to it and serves to transfer the data bit D4 in the normal operating mode. The latter contact area takes over the function of the first contact area 1 in the test operating mode and then serves for the application of the address signal A0. Also illustrated is the third contact area 3 for the application of the control signal CTR, which determines the operating mode, as well as a fourth contact area 4, which is disposed at the bottom left on the circuit IC in FIGS. 1 and 2 and is used to output a compressed result signal during the testing of the integrated memory circuit IC.

The first contact area 1 is connected to an address register ABUF via a first driver I1 and also a multiplexer MUX, an address bit A0 which is present at the first contact area 1 in the normal operating mode is stored in an address register ABUF. An output of the address register ABUF is connected to further non-illustrated components of the integrated memory circuit IC.

The second contact area 2 is connected to a data register DBUF or via a second driver I2 and a fourth driver I4, connected downstream thereof, and also a third driver I3, reverse-connected in parallel with both of the drivers I2, I4. The data register buffer DBUF stores data that are present at the second contact area 2 in the normal operating mode and are to be written to memory cells MC of the integrated memory circuit IC or data which are to be read from the memory cells MC before outputting to the second contact area 2. Only the path containing the second driver I2 and the fourth driver I4 is active during the operation of writing to the memory cell MC and only the path containing the third driver I3 is active during the operation of reading from the memory cell MC. Requisite switches and/or activation signals are not illustrated in FIG. 3.

The changeover between the two operating modes is now discussed. The third contact area 3 has no signal applied to it in the normal operating mode. A pull-up resistor R connected to it ensures that it has a high potential VCC in this case. This has the advantage that only in the test operating mode does a signal have to be applied to the third contact area 3, in order to shift its potential to a low level (earth). If, for example at a point in time when the integrated circuit is provided with a housing, the function of the test operating mode is no longer desired, it is not necessary for the third contact area to be subsequently connected to a fixed potential for the purpose of permanently setting the normal operating mode. Additional work steps are avoided as a result of this.

The third contact area 3 is connected to activation inputs of the first driver I1, the third driver I3, the fourth driver I4 and the multiplexer MUX. If no potential is applied externally to the third contact area 3, the drivers I1, I3 and I4 are activated and the multiplexer MUX connects the output of the first driver I1 to the input of the address register ABUF. In the test operating mode, on the other hand, the control signal CTR with a low level (ground) is applied to the third contact area 3, as a result of which the drivers I1, I3, I4 are deactivated. No data can then be read from the first contact area 1 via the first driver I1 into the address register ABUF or from the second contact area 2 via the fourth driver I4 into the data register DBUF. In addition, no data can then be read out via the third driver I3 from the data register DBUF to the second contact area 2. In addition, in the event of the low level of the control signal CTR, the multiplexer MUX is switched such that it connects the output of the second driver I2 to the input of the address register ABUF. Consequently, in the test operating mode the address signal A0 can be read into the address register ABUF via the second contact area 2, while the first contact area 1 has no function, that is to say no signals are transferred via the first contact area 1 in this case.

The memory IC contains a corresponding circuit for each of the first contact areas 1 and its associated second contact area 2. Therefore, four contact areas are available for the transfer of address signals A0 . . . A3 in the two operating modes. This advantageously makes it possible, in the test operating mode as well, for different operating modes to be activated by the application of specific address signals to the integrated memory circuit IC, as is provided in accordance with the JEDEC standard for DRAMS ("JEDEC Test Mode Entry").

In the exemplary embodiment illustrated in FIG. 3, the second contact area 2 serves to transfer a data signal D4 only in the normal operating mode, and not during the test operating mode. The following text provides an explanation of how testing of the integrated memory circuit IC is nonetheless carried out with the aid of data compression.

The multiplexer MUX in FIG. 3 is connected to the input of a register REG, to which, in the test operating mode, test data present at the second contact area are written, the test data being in the form of four bits. For this purpose, provision may be made for the four bits to be transferred into the register REG in each case one after the other via the second contact area 2. As an alternative, however, it is also possible for the four bits to be written to the register REG simultaneously in parallel via the second contact area 2 and three further terminals (not illustrated) which are provided with corresponding multiplexers just like the second contact area illustrated.

After the operation of writing to the register REG, its content is simultaneously written to four memory cells, subsequently read simultaneously from the memory cells again and fed to a comparator CMP, which checks the data that have been read out with the content of the register REG. The comparator CMP communicates a corresponding result signal R via a fifth driver I5 to the fourth contact area 4, which serves to transfer a data signal D1 in the normal operating mode as well. In the manner described, the data required for testing the integrated memory circuit IC can be transferred in a compressed manner from and to a point outside the integrated memory circuit IC, with the result that the smaller number of data contact areas in the test operating mode suffices to carry out testing of the integrated memory circuit IC.

The register REG and the address register ABUF define a first sub-circuit 10 while the data register DBUF defines a second sub-circuit 20 of the integrated circuit IC.

FIG. 4 shows two integrated memory circuits IC which are disposed such that they are adjacent on a wafer and are both configured like the integrated memory circuit IC illustrated in FIGS. 1 and 2. The test method according to the invention is illustrated, in which method the integrated memory circuits IC are put into the test operating mode and thus have the signal allocation of their contact areas P which is shown in FIG. 2. The ends of test contacts T are shown, the test contacts T are in the form of test probes of a test apparatus TA to which the contact areas P respectively disposed on the lower and upper sides of the main areas MA of the integrated memory circuits IC are contact-connected, so that signals can be transferred between the test apparatus and the integrated memory circuits IC. By virtue of the fact that none of the contact areas P which border exclusively on the respectively left-hand and right-hand sides of the main areas MA are required for signal transfer in the test operating mode, the two integrated memory circuits IC can be tested solely via the test contacts T depicted in FIG. 4. FIG. 4 reveals that the contact areas P can be contact-connected without the test contacts T experiencing a crossover, with the result that a much larger number of identical circuits disposed to the left and right of the integrated memory circuits IC illustrated can also be tested simultaneously.

By virtue of the fact that all the first contact areas are replaced by second contact areas in the second operating mode, all the address signals can be fed to the integrated memory circuit IC in both operating modes even though not all of the contact areas of the circuit are contact-connected to test probes. In the second operating mode, fewer data contact areas suffice to test the circuit. This is achieved by the data compression, explained with reference to FIG. 3, in the course of writing in test data and reading out result signals for four test bits read out simultaneously.

Figure 5:
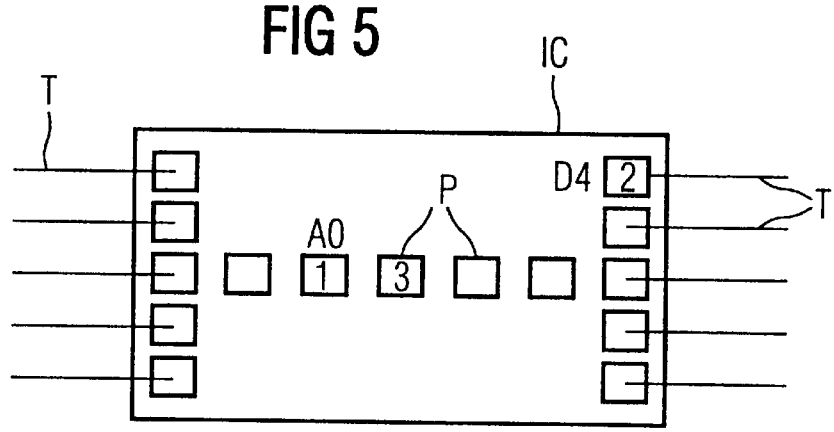
FIG. 5 is a plan view of an alternative integrated circuit to that of FIG. 1, with a different configuration of its contact areas.

FIG. 5 shows another exemplary embodiment of the integrated memory circuit IC, in which the first 1 and second 2 contact areas are disposed in rows of contact areas having a different reciprocal configuration from those of the circuit in FIGS. 1, 2 and 4. The contact areas are disposed, on the one hand, along a row which, in the plan view shown, is disposed centrally on the chip surface and parallel to the upper and lower edges of the chip. This row contains one of the first contact areas 1. The integrated memory circuit IC has two further columns of contact areas respectively disposed on the left and on the right at the edge of the main area MA of the chip and parallel to the side edges thereof. The right-hand row of contact areas contains the second contact area 2 assigned to the first contact area 1.

FIG. 5 also again depicts the test probes T which, in the test operating mode, make contact only with the two mutually parallel rows of contact areas. In the test operating mode, the function of the first contact area 1 is again taken over by the second contact area 2 assigned to it. Analogously to FIG. 4, it is possible without any difficulties for a larger number of such integrated memory circuits IC to be simultaneously contact-connected to test probes T and tested, provided that they are disposed to be adjacent to those sides or edges of the main area MA of the chip illustrated which lie at the top and bottom in FIG. 5. The test probes T then again need be attached to the integrated memory circuits IC only from the right and left but not simultaneously from the top and bottom.

We claim:

1. An integrated circuit, comprising:
   a first sub-circuit;
   a first contact area transferring data to and from said first sub-circuit during a first operating mode, said first contact area being electrically separated from said first sub-circuit during a second operating mode and hence transferring no data to and from said first sub-circuit during the second operating mode;
   a second sub-circuit; and
   a second contact area transferring data to and from said second sub-circuit in the first operating mode, in the second operating mode said second contact area being used for transferring data to and from said first sub-circuit which are transferred via said first contact area in the first operating mode.

2. The integrated circuit according to claim 1, including a main area having rows of contact areas disposed parallel to different sides of said main area and said first contact area and said second contact area disposed in said rows of contact areas, said first contact area disposed in a different row of said rows of contact areas than said second contact area.

3. The integrated circuit according to claim 2, wherein said main area has first opposite sides and second opposite sides, said first contact area is one of a plurality of first contact areas disposed on at least one of said first opposite sides of said main area, said second contact area is one of a plurality of second contact areas disposed on at least one of said second opposite sides of said main area.

4. The integrated circuit according to claim 1 wherein said first contact area, said second contact area, said first sub-circuit and said second sub-circuit define a memory circuit, said first contact area is one of a plurality of first contact areas, and at least one of said plurality of first contact areas serves, in the first operating mode, for transferring an address signal for addressing said memory circuit, and said second contact area serving, in the second operating mode, for transferring said address signal.

5. The integrated circuit according to claim 4, wherein said second contact area serves, in the first operating mode, to transfer data to and from said memory circuit.

6. The integrated circuit according to claim 1, including a third contact area for an application of a control signal, the control signal causing a changing over to said second operating mode.

7. An improved method for testing an integrated circuit, the integrated circuit having a main area with first contact areas and second contact areas disposed on the main area for providing external contact-connections, said first contact area and said second contact area are electrically separated from each other, the improvement which comprises:
   contact-connecting the second contact areas to test contacts of a test apparatus; and
   transferring signals from the test apparatus to the integrated circuit via the second contact areas during a test operating mode that are normally transferred via the first contact areas during a normal operating mode, no signals from the test apparatus to the integrated circuit are transferred via the first contact areas during the test operating mode.

8. The method according to claim 7, which comprises:
   configuring the main area with rows of contact areas each disposed parallel to different sides of the main area; and
   disposing the first contact areas in different rows of the rows of contact areas than the second contact areas.

9. The method according to claim 8, which comprises:
   disposing the first contact areas on at least one of two first opposite sides of the main area; and
   disposing the second contact areas on at least one of two second opposite sides of the main area.

10. A testing method, which comprises:
    providing an integrated circuit having a main area with rows of contact areas disposed parallel to different sides of the main area, the rows of contact areas having first contact areas and second contact areas for providing external contact-connections and the first contact areas are disposed in a different row of the rows of contact areas than the second contact areas, said first contact areas and said second contact areas are electrically separated from each other;
    providing a further integrated circuit having a further main area with further rows of contact areas disposed parallel to different sides of the further main area, the further rows of contact areas having further first contact areas and further second contact areas for providing external contact-connections and the further first contact areas are disposed in a different row of the further rows of contact areas than the further second contact areas, said further first contact areas and said further second contact areas are electrically separated from each other;
    disposing the further integrated circuit on one side of the main area of the integrated circuit having at least one of the first contact areas;
    contact connecting the second contact areas and the further second contact areas to test contacts of a test apparatus;
    transferring signals via the second contact areas and the further second contact areas during a test operating mode that are transferred via the first contact areas and further first contact areas during a normal operating mode; and
    testing simultaneously the integrated circuit and the further integrated circuit.

* * * * *